(12) United States Patent
Searle et al.

(10) Patent No.: US 7,969,240 B2
(45) Date of Patent: Jun. 28, 2011

(54) GAIN CONTROL FOR LINEAR RADIO FREQUENCY POWER AMPLIFIERS

(75) Inventors: Kenneth Searle, Essex (GB); Edward John Whittaker, Hertfordshire (GB)

(73) Assignee: SiGe Semiconductor Inc., Ottawa (CA)

( * ) Notice: Subject to any disclaimer, the term of this patent is extended or adjusted under 35 U.S.C. 154(b) by 0 days.

(21) Appl. No.: 12/499,516

(22) Filed: Jul. 8, 2009

(65) Prior Publication Data

US 2010/0007414 A1    Jan. 14, 2010

Related U.S. Application Data

(60) Provisional application No. 61/078,979, filed on Jul. 8, 2008.

(51) Int. Cl.
*H03G 3/20* (2006.01)
(52) U.S. Cl. .......................... 330/127; 330/133
(58) Field of Classification Search .................. 330/133, 330/98, 150, 310, 296, 289, 127, 297, 279
See application file for complete search history.

(56) References Cited

U.S. PATENT DOCUMENTS

| | | | |
|---|---|---|---|
| 5,670,912 | A | 9/1997 | Zocher |
| 6,917,243 | B2 * | 7/2005 | Doherty et al. ............... 330/133 |
| 7,420,421 | B1 | 9/2008 | Lie et al. |
| 2005/0242882 | A1 | 11/2005 | Anderson |
| 2008/0139146 | A1 | 6/2008 | Behzad |

OTHER PUBLICATIONS

UK Search Report, "Patents Act 1977: Search Report under Section 17", dated Sep. 24, 2009, 1 pg.

* cited by examiner

*Primary Examiner* — Robert Pascal
*Assistant Examiner* — Hieu P Nguyen
(74) *Attorney, Agent, or Firm* — Morris & Kamlay LLP

(57) ABSTRACT

A bias control circuit is provided comprising an input port for receiving a signal indicative of an amplitude of a supply voltage provided to a multi stage power amplifier circuit. Electronic circuitry, electrically coupled to the input port, generates a bias control signal in dependence upon the signal indicative of a supply voltage for provision to a first stage power amplifier of the multi stage power amplifier circuit. The bias control signal is generated such that a gain change of the multi stage power amplifier circuit due to a supply voltage change is substantially compensated.

19 Claims, 10 Drawing Sheets

GAIN CONTROL FOR LINEAR RADIO FREQUENCY POWER AMPLIFIERS

CROSS-REFERENCE TO RELATED APPLICATION

This application claims the benefit of U.S. Provisional Patent Application No. 61/078,979 filed on Jul. 8, 2008, the entire contents of which are incorporated herein by reference.

FIELD OF THE INVENTION

The instant invention relates to the field of power amplifier circuits and in particular to a constant gain control for linear radio frequency power amplifiers.

BACKGROUND

Wireless Local Area Network (WLAN) technology is becoming widely used in home, office, and in mobile applications. In WLAN systems, modulation techniques such as, for example, 64 Quadrature Amplitude Modulation (QAM) Orthogonal Frequency Division Multiplexing (OFDM) in WLAN 802.11g systems are used for the data transmission. In order for the modulation technique to function reliably, the gain and phase of a Power Amplifier (PA) within the transmitter needs to be substantially linear. A proxy for linearity is Error Vector Magnitude (EVM) expressed in percentage terms. WLAN PAs with an EVM <3% up to a specific power output level are generally considered sufficiently linear to enable the transmission of a full rate 64 QAM with a low packet error rate. Of course, a higher output level from the PA allows for a broader range to the receiving WLAN base station. Therefore, linear power delivery up to the maximum power level before exceeding 3% EVM is sometimes used as a figure of merit for WLAN PAs.

In WLAN systems data is transmitted in bursts. At the start of each burst is a calibration sequence, where the amplitude of the received Radio Frequency (RF) signal is determined for the duration of the burst. The PA RF output signal amplitude depends largely on the stability of the gain of the PA. Unfortunately, the gain of linear PAs tends to increase with increasing supply voltage because the increased supply voltage causes an improvement to the high frequency performance of the underlying semiconductor transistors forming amplification stages within the PA. In most stationary applications of WLAN systems the supply voltage to the PA is sufficiently stable during the burst for this effect to be unnoticeable. However, in the case of WLAN PAs used in battery operated devices—for example, mobile devices such as Global System for Mobile Communication (GSM) cell phones this is not the case. In mobile devices the supply voltage of the PA is directly provided from the battery. Since the output impedance of batteries such as, for example, Li ion batteries, is relatively high, the supply voltage of the PA drops by approximately 400 mV during a data burst and recovers by the same amount after the data burst.

A state-of-the-art solution to this problem is to add a regulator between the battery and the supply voltage to the PA. However, adding the regulator increases complexity and cost, uses valuable space—especially in handheld mobile devices, and reduces overall efficiency of the device.

It would be desirable to overcome at least some of the drawbacks of the prior art.

SUMMARY OF EMBODIMENTS OF THE INVENTION

In accordance with an aspect of the present invention there is provided a bias control circuit comprising:

an input port for receiving a signal indicative of an amplitude of a supply voltage, the supply voltage for being provided to a multi stage power amplifier circuit;

electronic circuitry electrically coupled to the input port, the electronic circuitry for generating, in dependence upon the signal indicative of a supply voltage, a bias control signal for provision to a first stage power amplifier of the multi stage power amplifier circuit, the bias control signal being generated such that a gain change of the multi stage power amplifier circuit due to a supply voltage change is substantially compensated; and, an output port electrically coupled to the electronic circuitry, the output port for being electrically coupled to a bias port of the first stage power amplifier and for providing the bias control signal thereto.

In accordance with an aspect of the present invention there is provided a method comprising:

receiving a signal indicative of an amplitude of a supply voltage, the supply voltage for being provided to a multi stage power amplifier circuit;

generating a bias control signal in dependence upon the signal indicative of a supply voltage, the bias control signal for provision to a first stage power amplifier of the multi stage power amplifier circuit, the bias control signal being generated such that a gain change of the multi stage power amplifier circuit due to a supply voltage change is substantially compensated; and, providing the bias control signal to the first stage power amplifier.

In accordance with an aspect of the present invention there is provided a multi stage power amplifier circuit comprising:

an input port for receiving a radio frequency signal;

a plurality of power amplifiers for successively amplifying the radio frequency signal, a first power amplifier being connected to the input port for receiving the radio frequency signal and a last power amplifier being connected to an output port for providing an amplified radio frequency signal;

supply circuitry connected to each of the power amplifiers for providing a supply voltage;

a sensor for sensing the supply voltage and for providing a signal indicative of an amplitude of the supply voltage; and, electronic control circuitry connected to the sensor and to a bias port of the first power amplifier, the electronic control circuitry for generating a bias control signal in dependence upon the signal indicative of a supply voltage for provision to the first power amplifier, the bias control signal being generated such that a gain change of the plurality of power amplifiers due to a supply voltage change is substantially compensated.

In accordance with an aspect of the present invention there is provided a storage medium having stored therein executable commands for execution on a processor, the executable commands for when executed resulting in an electronic circuit design comprising:

an input port for receiving a signal indicative of an amplitude of a supply voltage, the supply voltage for being provided to a multi stage power amplifier circuit;

electronic circuitry connected to the input port, the electronic circuitry for generating a bias control signal in dependence upon the signal indicative of a supply voltage for provision to a first stage power amplifier of the multi stage power amplifier circuit, the bias control signal being generated such that a gain change of the multi stage power amplifier circuit due to a supply voltage change is substantially compensated; and, an output port connected to the electronic circuitry, the output port for being connected to a bias port of the first stage power amplifier.

BRIEF DESCRIPTION OF THE FIGURES

Exemplary embodiments of the invention will now be described in conjunction with the following drawings, in which.

DETAILED DESCRIPTION OF EMBODIMENTS OF THE INVENTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the invention. Thus, the present invention is not intended to be limited to the embodiments disclosed, but is to be accorded the widest scope consistent with the principles and features disclosed herein.

The gain of a multi stage PA is influenced by bias currents provided to each of its amplification stages. However, it has been observed that provision of a bias current is substantially constrained when the linear PA is amplifying large signals, for example, the PA is amplifying signals having a high modulation index or is driven into class B operation. In a multi stage PA employing, for example, 3 stages, the last 2 stages are typically amplifying large signals. The output stage is, for example, configured such that it exhibits a monotonically decreasing gain or very little gain peaking as the output level increases from small signal towards saturation. The quiescent current is set sufficiently low to conserve power when the PA is operated at low output power. The current is, for example, set to be Proportional To Absolute Temperature (PTAT) thereby giving the stage a gain that is substantially independent of temperature.

Figure 1A:
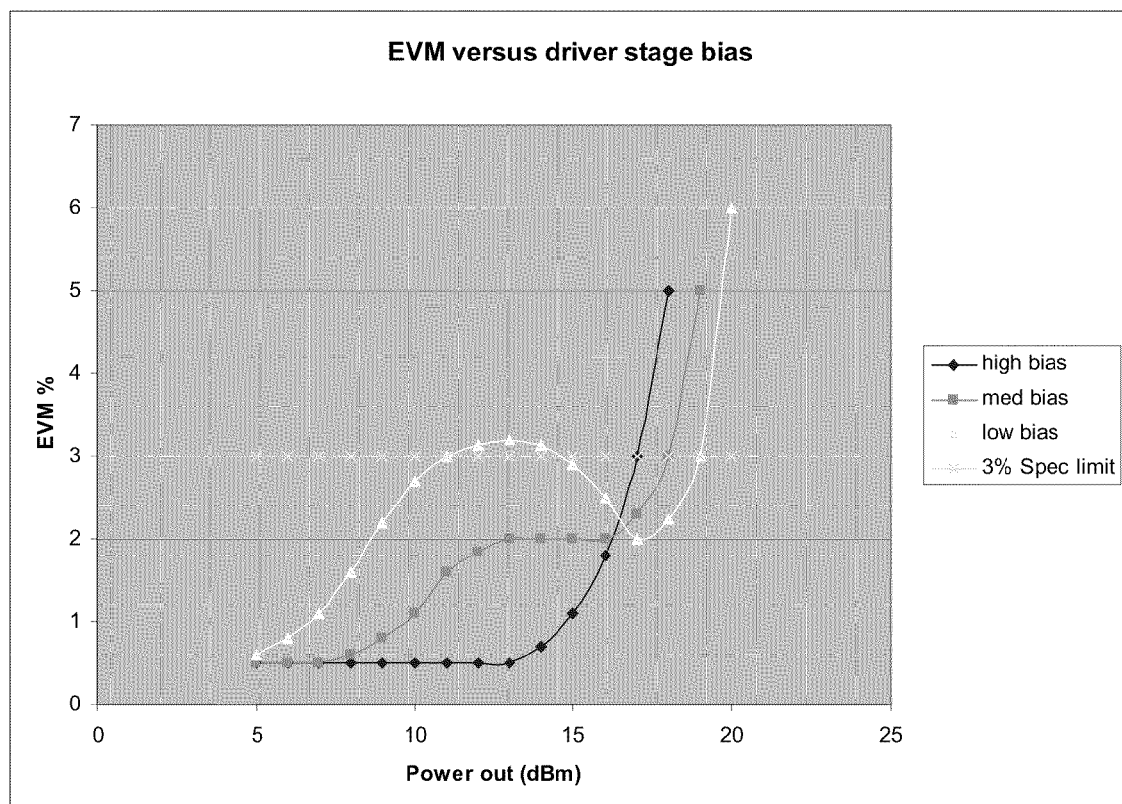
FIG. 1a is a diagram illustrating Error Vector Magnitude versus signal power for different levels of bias provided to a driver stage of a PA.

The driver stage positioned prior to the output stage is then, for example, biased to have a gain characteristic which has a small peak just as the gain of the output stage begins to fall. This extends the linear power handling of the multi stage PA by flattening the overall gain characteristic. However, if the driver stage peaks excessively, the overall gain flatness of the multi stage PA is impaired which manifests itself as an increase in distortion or non-linearity at moderate signal levels. A plot of EVM versus signal power instead of increasing monotonically as saturation is approached exhibits a broad plateau region of increased distortion at moderate power levels, as shown in FIG. 1a. If the driver stage gain peaking is further increased the moderate power level distortion is also further increased and the EVM plateau changes to a hump characteristic likely exceeding the 3% EVM threshold where the operation of the multi stage PA is considered to be linear. In other words, there is a compromise between signal handling of the multi stage PA—using biasing—and the non linearity of the multi stage PA at moderate signal levels. Therefore, the range of bias current adjustment for the driver and output stage—without substantially distorting the amplified signal—is very limited, thereby prohibiting correction of changes in the supply voltage by adjusting the bias current of the driver and output stage of the multi stage PA.

Figure 1B:
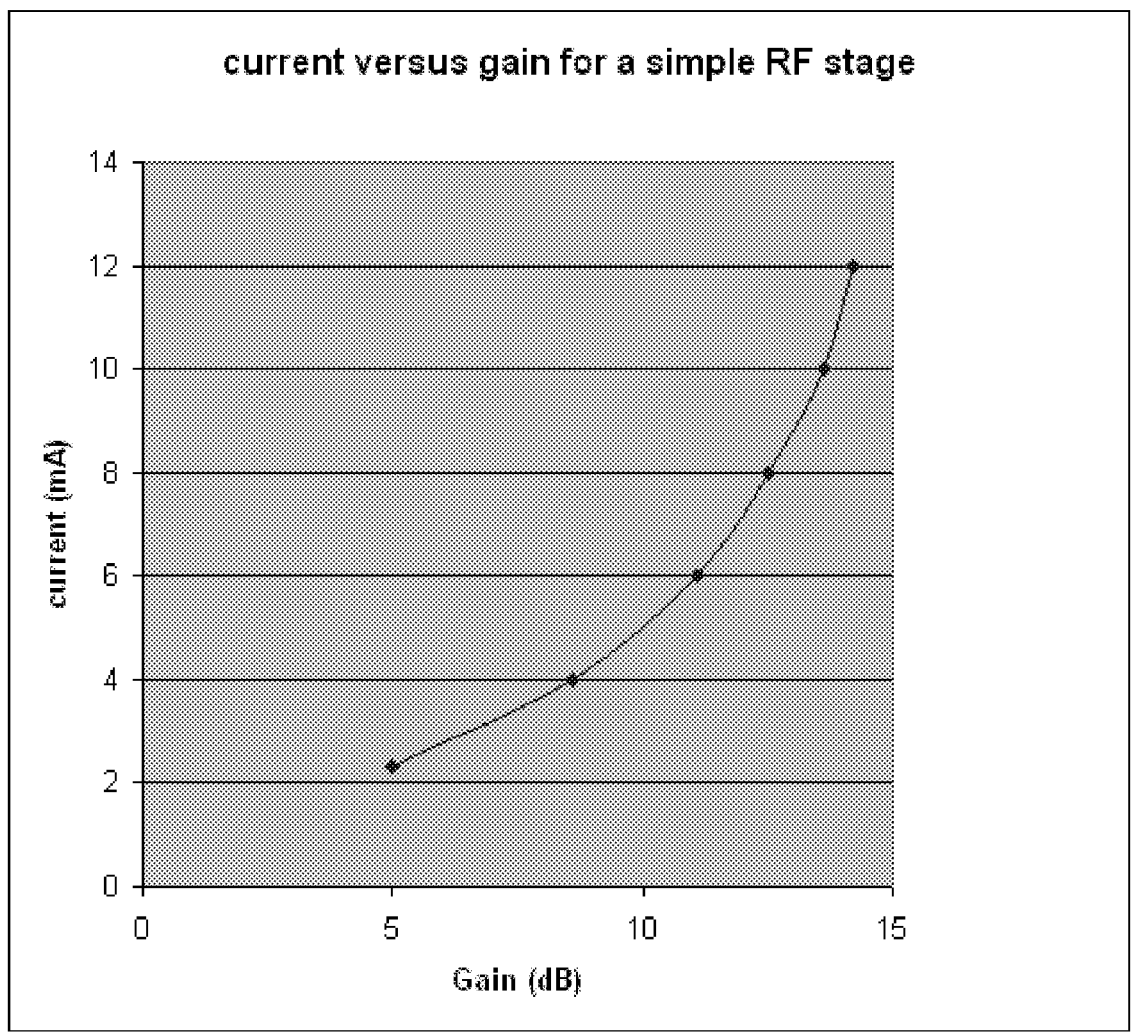
FIG. 1b is a diagram illustrating gain variation versus bias current of a RF small signal stage at 2.45 GHz.

In a multi stage PA, the first stage is amplifying relatively small signals and is, therefore relatively linear over a wide range of bias current levels. The driver and the output stage of the multi stage PA suffer a gain reduction when the supply voltage decreases—expressed in Decibels per Volt (dB/V)—which is substantially independent of the absolute level of the supply voltage. In a bias current control circuit according to embodiments of the invention a bias current is generated and provided to the first stage PA such that it increases when the supply voltage decreases in a fashion that the output signal of the first stage PA is sufficiently increased to substantially compensate a gain reduction of the driver and output stages due to the decreased supply voltage. However, the relation between bias current and gain expressed in dB of an RF amplifying stage is not linear, as illustrated in FIG. 1b depicting the gain variation of such a stage at 2.45 GHz.

For example, an uncompensated multi stage PA implemented using SiGe technology experiences a gain variation of 1 dB/V to 1.2 dB/V. However, for operation in portable WLAN devices such as, for example, a GSM cell phone, the acceptable gain variation of the multi stage PA is limited to 0.7 dB/V, a reduction by a factor of nearly two. Typically, in the context of mobile applications the supply voltage is between approximately 2.3V and 4.8V. Therefore, the maximum acceptable gain variation is 1.75 dB. While embodiments of the invention will be described in relation to this example for the sake of simplicity, it will become evident to those skilled in the art that the embodiments of the invention are not limited thereto, but are also implementable for accommodating various other frequency ranges, acceptable gain variations, levels and variations of the supply voltage depending on design specifications of various applications.

Figure 2:
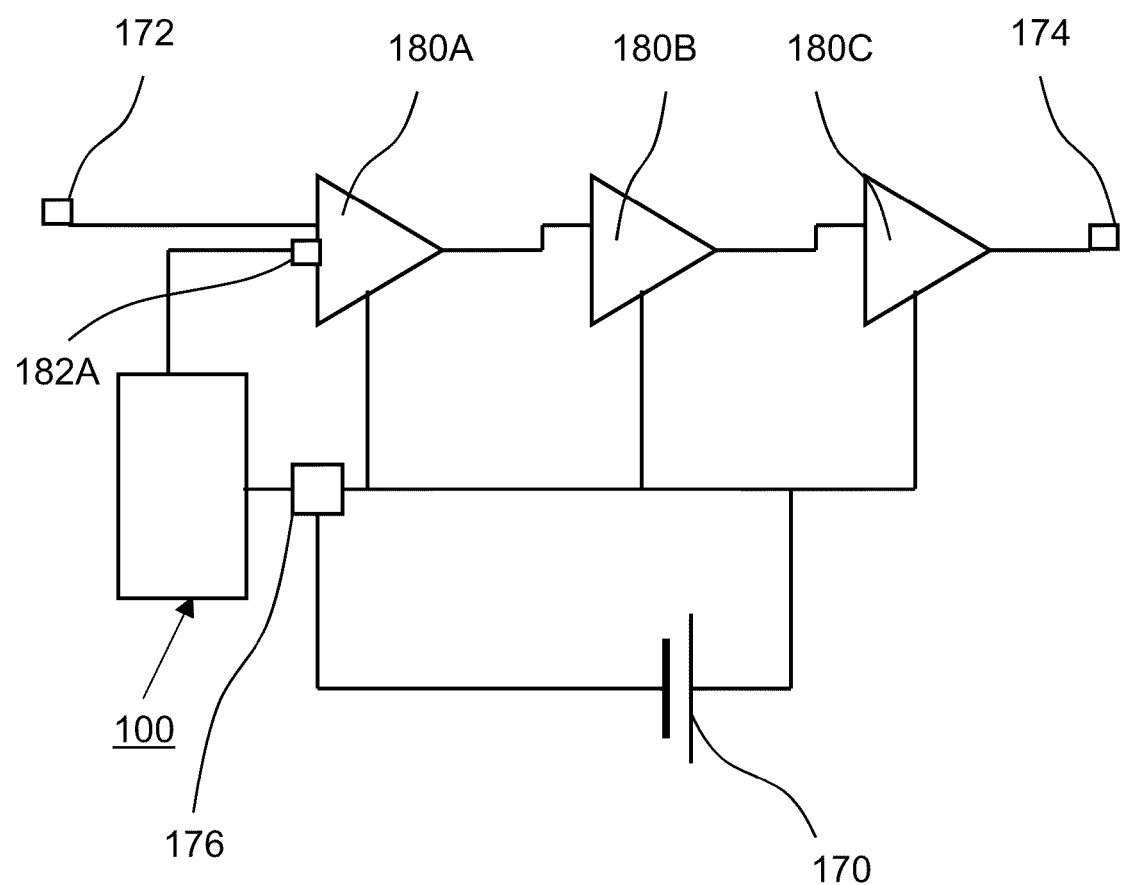
FIG. 2 is a simplified circuit diagram of a multistage power amplifier having a bias control circuit with a sensor for sensing a supply voltage.

Referring to FIG. 2, a multi stage power amplifier is shown with three amplifier stages 180A, 180B, and 180C comprising a bias control circuit 100 according to embodiments of the invention. A RF input signal is received at input port 172, amplified at the first stage amplifier 180A, further amplified at the following driver stage amplifier 180B and output stage amplifier 180C, and then provided via output port 174 for further processing. The three amplifier stages 180A, 180B, and 180C are connected to supply voltage source 170. The bias current control circuit 100 is connected to a sensor 176 for sensing the supply voltage and providing a signal indicative of the supply voltage. Upon receipt of the signal indicative of the supply voltage, the bias control circuit 100 uses the signal indicative of the supply voltage to generate a bias signal which is then provided to a bias port 182A of the first stage amplifier 180A. The bias signal is generated such that a gain change of the multi stage power amplifier circuit due to a supply voltage change is substantially compensated. For example, the bias signal is a current signal generated using a polynomial current generator according to a predetermined gain variation profile. The gain variation profile is, for example, determined based on design specifications of the amplifiers—bias current versus gain profile of the first stage and gain change of the multi stage amplifier due to a supply voltage change—or through empirical determination. While FIG. 2 illustrates a three stage amplifier, it is apparent to those skilled in the art that the implementation of the bias control circuit 100 is not limited thereto but is also implementable with two stage amplifiers and multi stage amplifiers comprising more than three stages.

Figure 3:
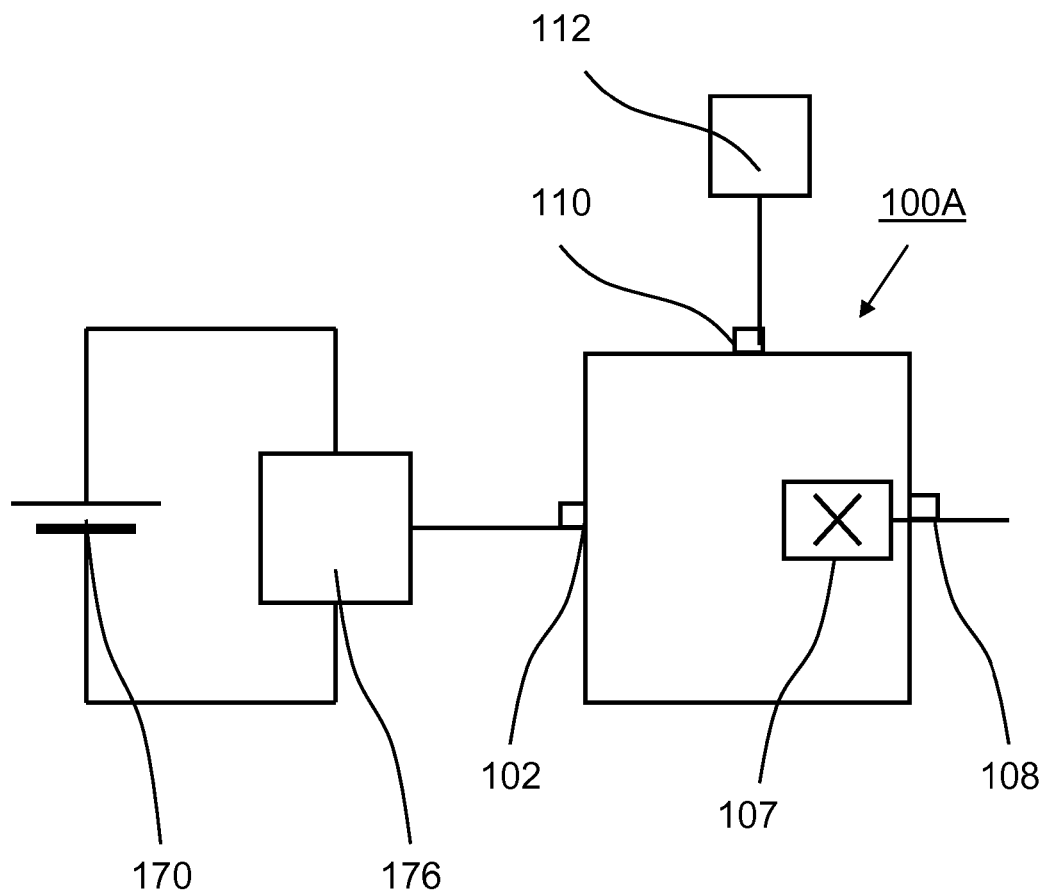
FIG. 3 is a simplified block diagram of a bias control circuit having a bias current generated in dependence upon a current signal proportional to the supply voltage.

Referring to FIG. 3, an embodiment 100A of the bias control circuit 100 is shown. A signal indicative of the supply voltage is received from the sensor 176 at input port 102, for example, as a current signal proportional to the supply voltage. Furthermore, the bias control circuit 100A is connected via port 110 to a current source 112—for example, a PTAT current source—for receiving a current signal. The bias control signal is then generated by dividing the current signal received from the current source 112 with the current signal proportional to the supply voltage received from the sensor 176 and is provided as a bias current signal via output port 108 to the bias port 182A of the first amplifier 180A. The generation of the bias current signal is then realized using for example an analog multiplier 107 for multiplying the current signal received from the current source 112 with the inverse of the current signal proportional to the supply voltage received from the sensor 176. This simple realization of the bias control circuit 100A is capable of reducing the overall gain variation of a multi stage power amplifier due to changes in the supply voltage to approximately 0.3 dB/V, which is well below the target of 0.7 dB/V suitable for the GSM cell phone application. Using a PTAT current source for generating the bias current signal enables keeping the transconductance of the first stage amplifier 180A temperature independent. Alternatively, the bias control signal is generated using digital signal processing methods.

The overall gain of the multi stage power amplifier 180 is still temperature dependent due to a constant bias signal provided to the driver stage 180B. Optionally, this is controlled by changing the PTAT current signal into a current source signal with a steeper temperature characteristic.

Figure 4:
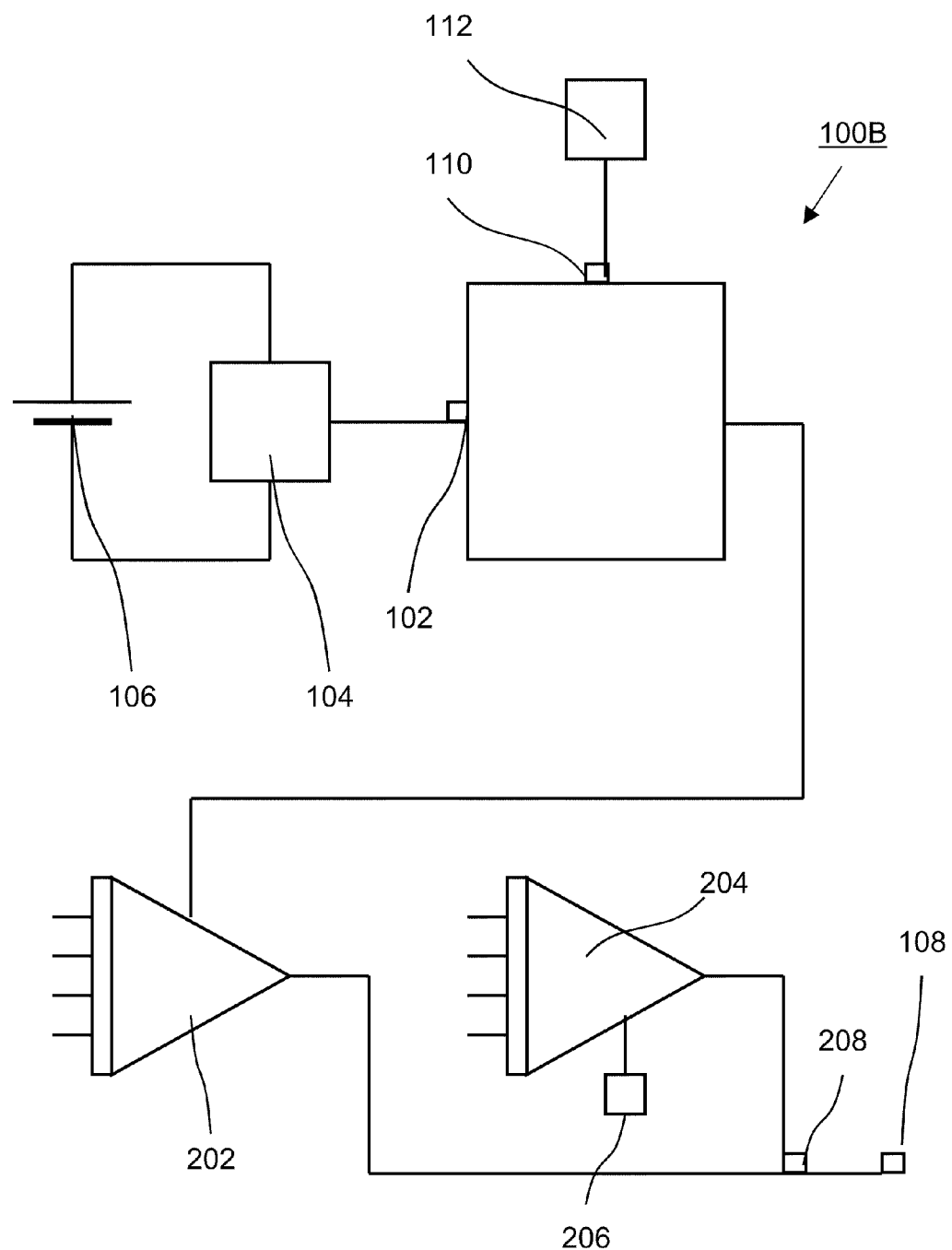
FIG. 4 is a simplified circuit diagram of a multistage power amplifier having bias current compensation therein.

Referring to FIG. 4, an embodiment 100B of the bias control circuit 100 is shown, with same reference numerals indicating same components as in FIGS. 2 and 3. Here, the correction is reduced by adding a supply voltage independent current signal from current source 206—for example, a PTAT current source—in node 208. The relative magnitudes of the supply voltage dependent portion of the bias signal and the supply voltage independent portion of the bias signal are adjusted using, for example, Digital to Analog Converters (DAC) 202 and 204, respectively, to enable more precise compensation. Furthermore, the bias control circuit 100B enables adjusting of the absolute gain of the multistage power amplifier. The DACs are programmed, for example, by serially loading data into the DACs from a microcontroller when the chip is enabled or by using chip e-fuses that are selectively programmed when the chip undergoes electrical test.

Figure 5:
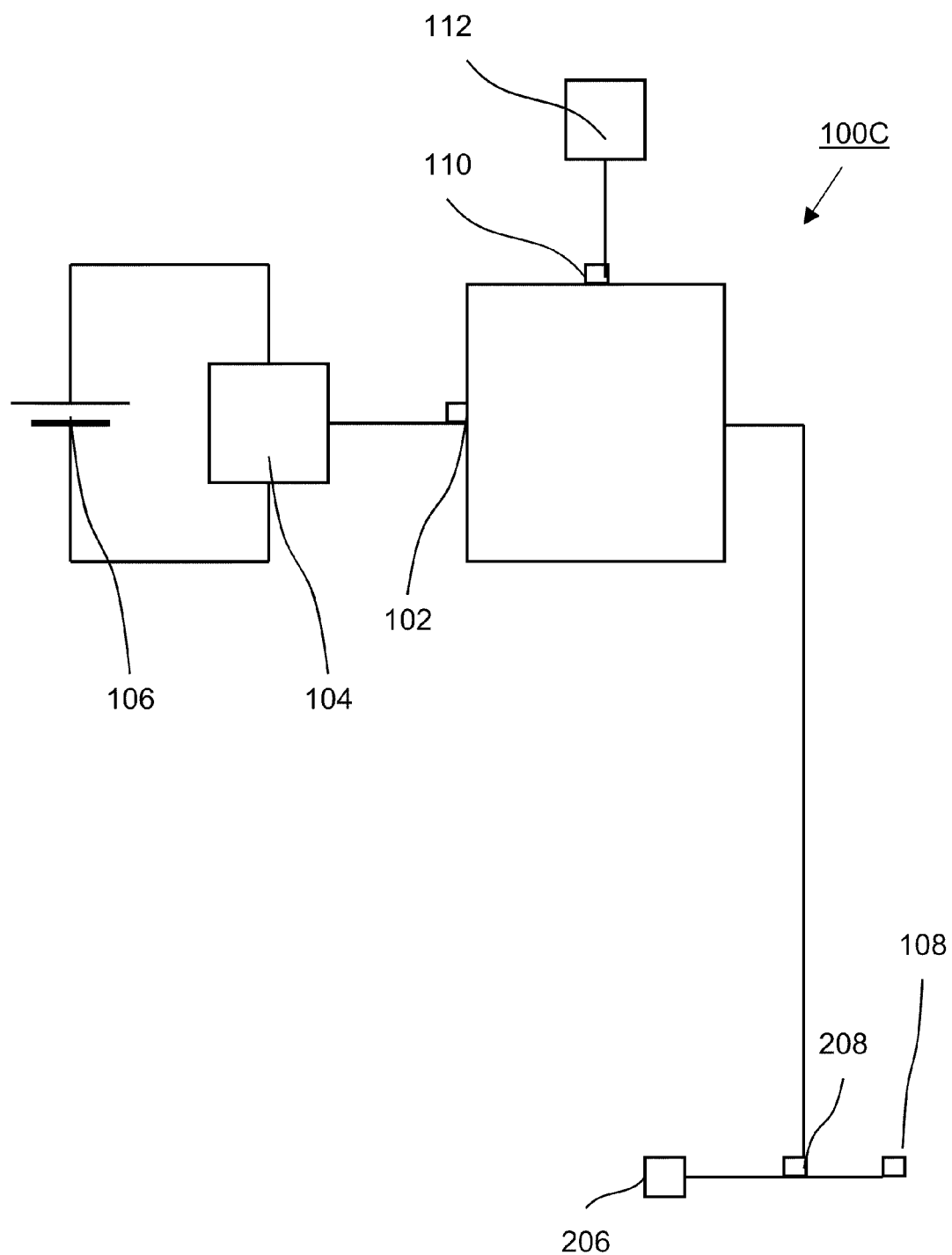
FIGS. 5 through 7 are variations on a multistage power amplifier according to the invention.
Figure 6:
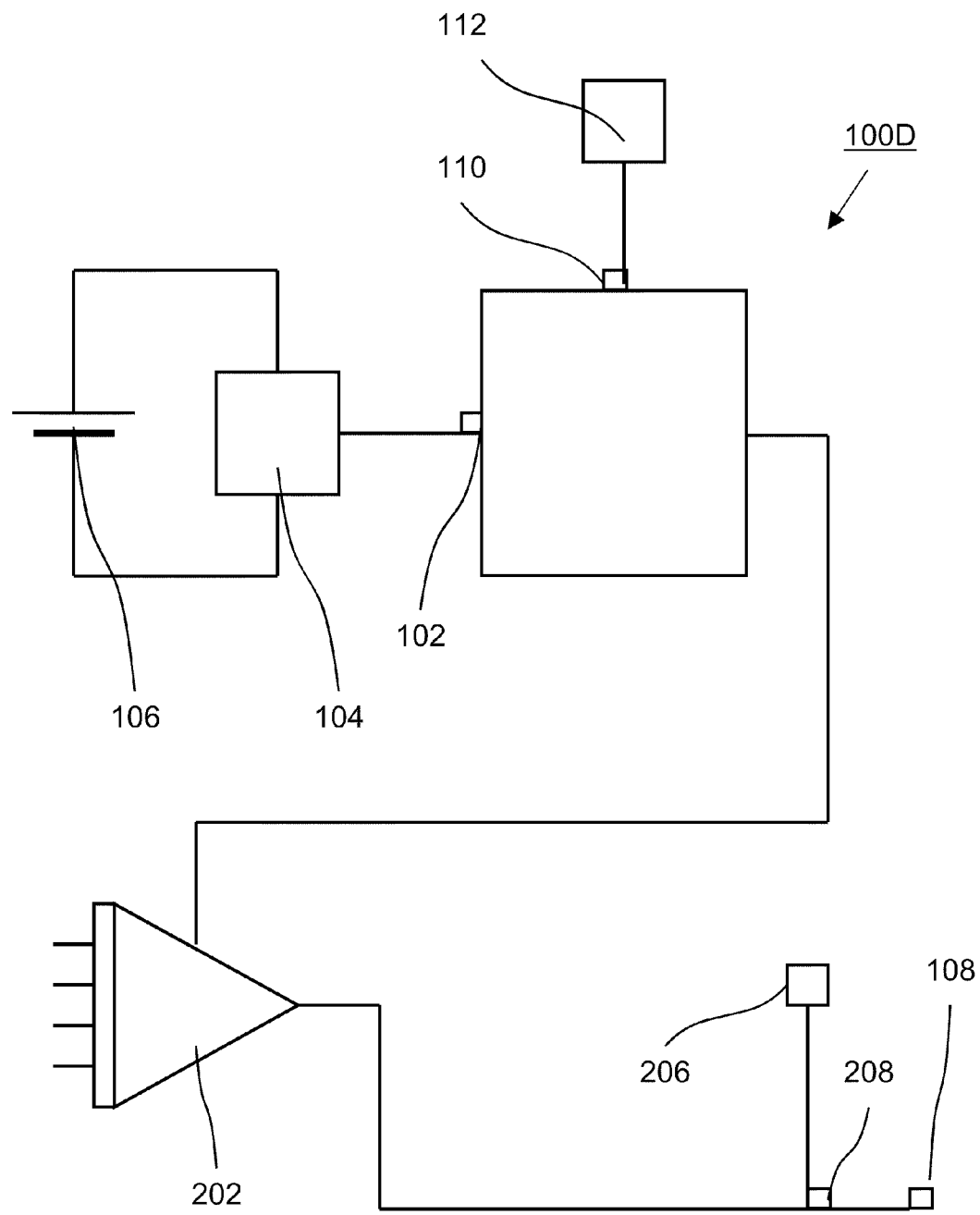
Figure 7:
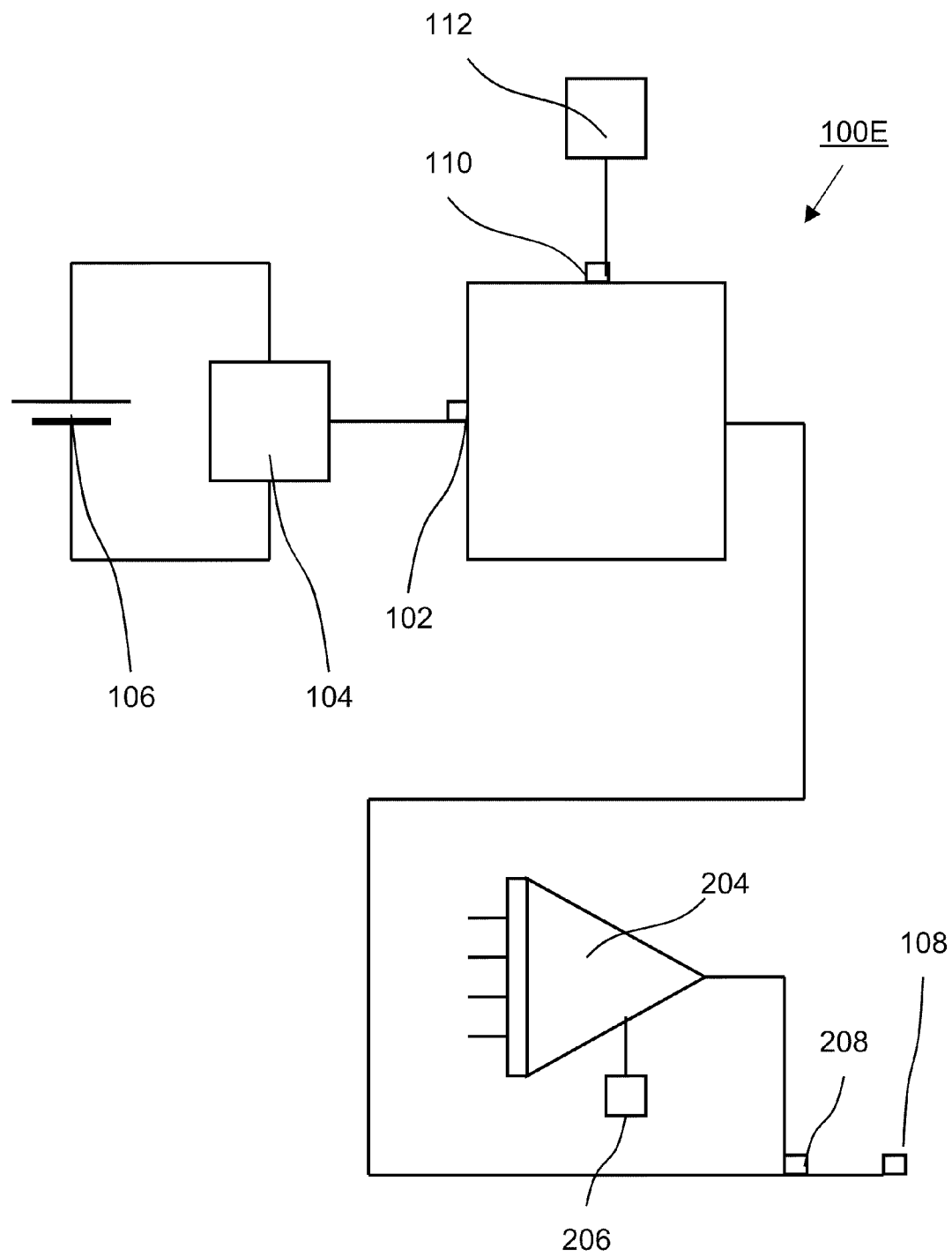

The embodiments 100C, 100D, and 100E shown in FIGS. 5, 6, and 7, respectively, are variations of the embodiments 100A and 100B, with same reference numerals indicating same components as in FIGS. 2 to 4. In particular, embodiment 100C provides a correction that is reduced by adding a supply voltage independent current signal from the current source 206 without adjusting the relative magnitudes, while in the embodiment 100D only the relative magnitude of the supply voltage dependent portion of the bias signal is adjusted and in the embodiment 100E only the relative magnitude of the supply voltage independent portion of the bias signal is adjusted.

Figure 8:
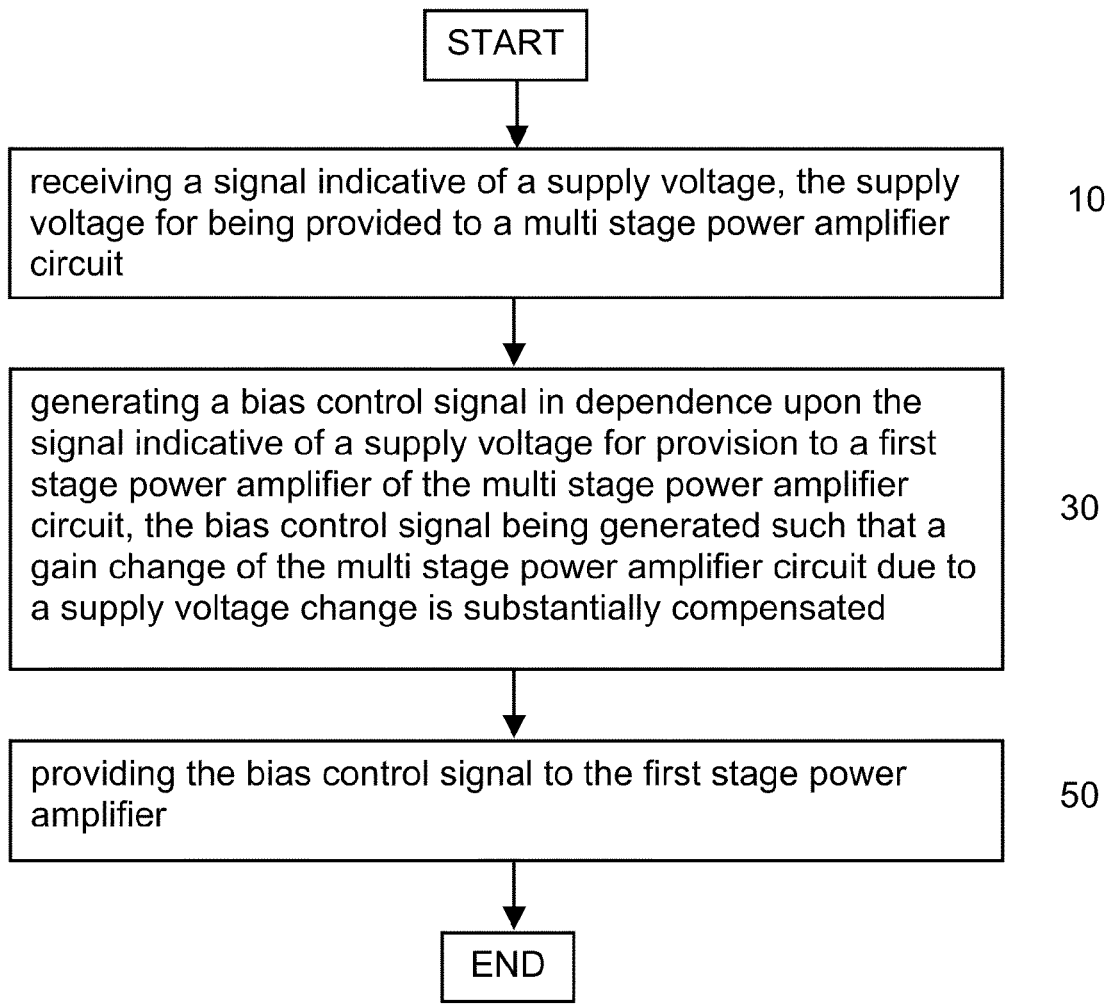
FIG. 8 is a simplified flow diagram of an embodiment.
Figure 9:
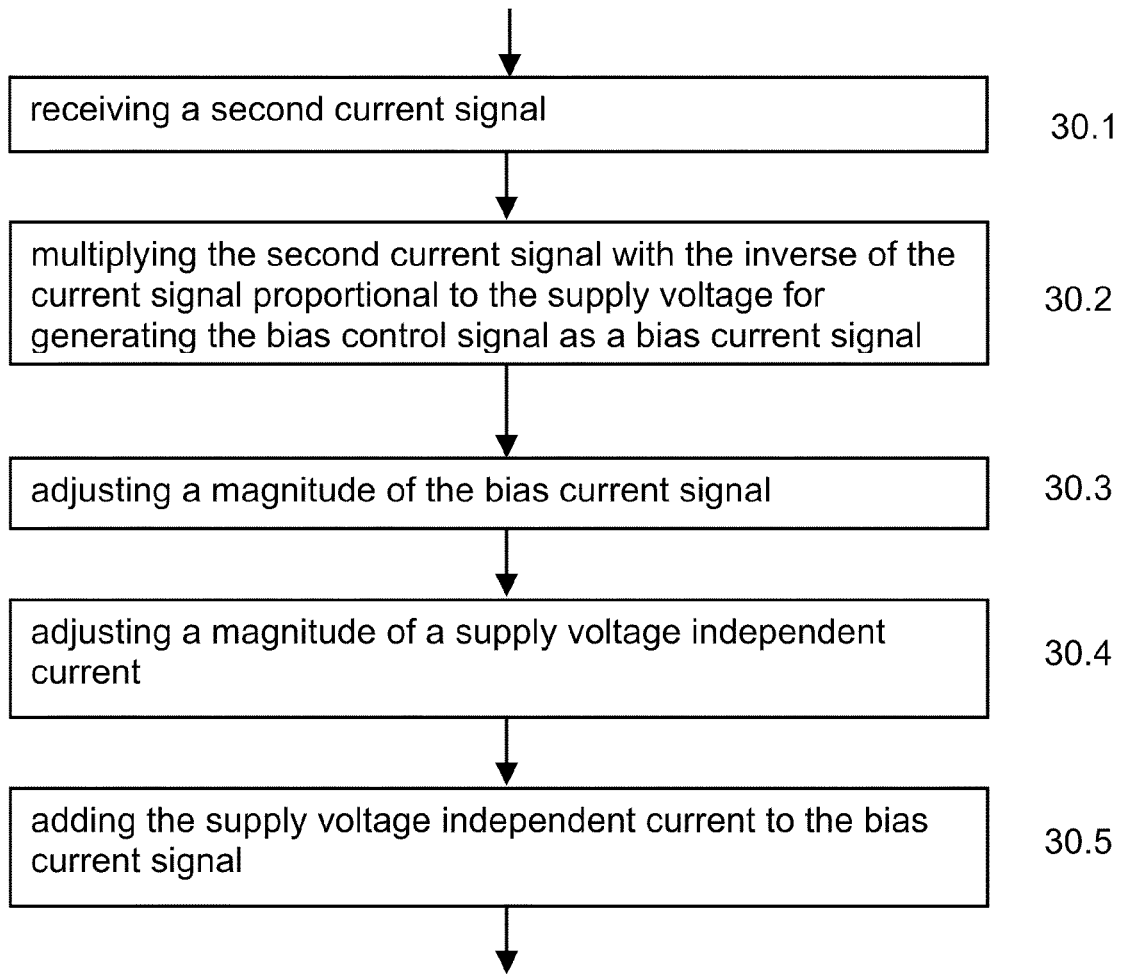
FIG. 9 is a simplified flow diagram of an embodiment relying on an inverse of a current signal proportional to the supply voltage for determining or adjusting the bias current.

Referring to FIGS. 8 and 9, simplified flow diagrams of a method for generating a bias control signal according to an embodiment of the invention for implementation with the embodiments of a bias control circuit 100 described above are shown. At 10, a signal indicative of a supply voltage provided to a multi stage power amplifier circuit is received. A bias control signal for provision to a first stage power amplifier 180A of the multi stage power amplifier circuit is then—30—generated in dependence upon the signal indicative of a supply voltage. The bias control signal is generated such that a gain change of the multi stage power amplifier circuit due to a supply voltage change is substantially compensated. At 50, the bias control signal is provided to a bias port of the first stage power amplifier 180A. The step 30 comprises, for example, receiving a second current signal—30.1—and multiplying the second current signal with the inverse of the current signal proportional to the supply voltage for generating the bias control signal as a bias current signal—30.2. Further steps are: adjusting a magnitude of the bias current signal—30.3; adjusting a magnitude of a supply voltage independent current—30.4; and adding the supply voltage independent current to the bias current signal—30.5.

Knowing system requirements such as, for example, the frequency ranges of the radiofrequency signal, specifications of the multi stage power amplifier, changes of the supply voltage, and acceptable overall gain variation of the multi stage power amplifier, design of various embodiments of the bias control circuit according to the invention is enabled using a processor executing commands based on the above description stored in a storage medium.

Numerous other embodiments of the invention will be apparent to persons skilled in the art without departing from the spirit and scope of the invention as defined in the appended claims.

What is claimed is:

1. A bias control circuit comprising:
an input port for receiving a signal indicative of an amplitude of a supply voltage, the supply voltage for being provided to a multi stage power amplifier circuit;
electronic circuitry electrically coupled to the input port, the electronic circuitry for generating, in dependence upon the signal indicative of a supply voltage, a bias control signal for provision to a first stage power amplifier of the multi stage power amplifier circuit, the bias control signal being generated such that a gain change of the multi stage power amplifier circuit due to a supply voltage change is substantially compensated;
an output port electrically coupled to the electronic circuitry, the output port for being electrically coupled to a bias port of the first stage power amplifier and for providing the bias control signal thereto; and
a second input port electrically coupled to the electronic circuitry for receiving a current signal,
wherein the electronic circuitry comprises a multiplier for generating the bias control signal in dependence upon the signal indicative of a supply voltage and the current signal.

2. A bias control circuit comprising:
an input port for receiving a signal indicative of an amplitude of a supply voltage, the supply voltage for being provided to a multi stage power amplifier circuit;
electronic circuitry electrically coupled to the input port, the electronic circuitry for generating, in dependence upon the signal indicative of a supply voltage, a bias control signal for provision to a first stage power amplifier of the multi stage power amplifier circuit, the bias control signal being generated such that a gain change of the multi stage power amplifier circuit due to a supply voltage change is substantially compensated;

an output port electrically coupled to the electronic circuitry, the output port for being electrically coupled to a bias port of the first stage power amplifier and for providing the bias control signal thereto;

a current source; and, output electronic circuitry disposed between the electronic circuitry and the output port and for being electrically coupled to the current source, the output electronic circuitry for receiving a supply voltage independent current from the current source and for adding the same to the bias control signal.

3. A bias control circuit as defined in claim 2 comprising:
a digital to analog converter electrically coupled to the output electronic circuitry and for being electrically coupled to the current source, the digital to analog converter for adjusting a magnitude of the supply voltage independent current in dependence upon a digital control signal.

4. A bias control circuit as defined in claim 2 wherein the current source is a proportional to absolute temperature (PTAT) current source for providing the supply voltage independent current.

5. A bias control circuit comprising:
an input port for receiving a signal indicative of an amplitude of a supply voltage, the supply voltage for being provided to a multi stage power amplifier circuit;

electronic circuitry electrically coupled to the input port, the electronic circuitry for generating, in dependence upon the signal indicative of a supply voltage, a bias control signal for provision to a first stage power amplifier of the multi stage power amplifier circuit, the bias control signal being generated such that a gain change of the multi stage power amplifier circuit due to a supply voltage change is substantially compensated;

an output port electrically coupled to the electronic circuitry, the output port for being electrically coupled to a bias port of the first stage power amplifier and for providing the bias control signal thereto, and a digital to analog converter disposed between the electronic circuitry and the output port, the digital to analog converter for adjusting a magnitude of the bias control signal in dependence upon a digital control signal.

6. A bias control circuit as defined in claim 5 comprising:
a current source; and, output electronic circuitry disposed between the digital to analog converter and the output port and for being electrically coupled to the current source, the output electronic circuitry for receiving a supply voltage independent current from the current source and for adding the same to the bias control signal.

7. A bias control circuit as defined in claim 6 comprising:
a second digital to analog converter electrically coupled to the output electronic circuitry and for being electrically coupled to the current source, the second digital to analog converter for adjusting a magnitude of the supply voltage independent current in dependence upon a second digital control signal.

8. A bias control circuit as defined in claim 6 wherein the current source is a proportional to absolute temperature (PTAT) current source for providing the supply voltage independent current.

9. A method comprising:
receiving a signal indicative of an amplitude of a supply voltage, the supply voltage for being provided to a multi stage power amplifier circuit;

generating a bias control signal in dependence upon the signal indicative of a supply voltage, the bias control signal for provision to a first stage power amplifier of the multi stage power amplifier circuit, the bias control signal being generated such that a gain change of the multi stage power amplifier circuit due to a supply voltage change is substantially compensated; and, providing the bias control signal to the first stage power amplifier, wherein the signal indicative of a supply voltage is a current signal proportional to the amplitude of the supply voltage, and wherein the method further comprises:
receiving a second current signal; and, multiplying the second current signal with the inverse of the current signal proportional to the supply voltage for generating the bias control signal as a bias current signal.

10. A method as defined in claim 9 wherein the second current signal is a proportional to absolute temperature current signal.

11. A method as defined in claim 9 comprising:
adding a supply voltage independent current to the bias current.

12. A method as defined in claim 11 comprising:
adjusting a magnitude of the supply voltage independent current.

13. A method as defined in claim 11 wherein the supply voltage independent current is a proportional to absolute temperature current signal.

14. A method as defined in claim 9 comprising:
adjusting a magnitude of the bias current signal.

15. A method as defined in claim 14 comprising:
adding a supply voltage independent current to the bias current signal.

16. A method as defined in claim 15 comprising:
adjusting a magnitude of the supply voltage independent current.

17. A method as defined in claim 15 wherein the supply voltage independent current is a proportional to absolute temperature current signal.

18. A multi stage power amplifier circuit comprising:
an input port for receiving a radio frequency signal;

a plurality of power amplifiers for successively amplifying the radio frequency signal, a first power amplifier being connected to the input port for receiving the radio frequency signal and a last power amplifier being connected to an output port for providing an amplified radio frequency signal;

supply circuitry connected to each of the power amplifiers for providing a supply voltage;

a sensor for sensing the supply voltage and for providing a signal indicative of an amplitude of the supply voltage;

electronic control circuitry connected to the sensor and to a bias port of the first power amplifier, the electronic control circuitry for generating a bias control signal in dependence upon the signal indicative of a supply voltage for provision to the first power amplifier, the bias control signal being generated such that a gain change of the plurality of power amplifiers due to a supply voltage change is substantially compensated; and a proportional to absolute temperature (PTAT) current source connected to the electronic circuitry, and wherein the electronic circuitry comprises a multiplier for generating the bias control signal in dependence upon the signal indicative of a supply voltage and a current signal received from the proportional to absolute temperature current source.

19. A multi stage power amplifier circuit as defined in claim 18 comprising:

a first digital to analog converter disposed between the electronic circuitry and the bias port, the digital to analog converter for adjusting a magnitude of the bias control signal in dependence upon a first digital control signal; and, a second digital to analog converter electrically coupled to a node disposed between the first digital to analog converter and the bias port and electrically coupled to one of the proportional to absolute temperature current source and a second other proportional to absolute temperature current source, the second digital to analog converter for receiving a supply voltage independent current and for adjusting a magnitude of the same in dependence upon a second digital control signal.

* * * * *